United States Patent
Lee et al.

(10) Patent No.: US 9,841,687 B2
(45) Date of Patent: Dec. 12, 2017

(54) SYNCHRONIZED INTEGRATED METROLOGY FOR OVERLAY-SHIFT REDUCTION

(71) Applicant: Taiwan Semiconductor Manufacturing Co., Ltd., Hsin-Chu (TW)

(72) Inventors: Yung-Yao Lee, Zhubei (TW); Heng-Hsin Liu, New Taipei (TW); Jui-Chun Peng, Hsinchu (TW); Yung-Cheng Chen, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 202 days.

(21) Appl. No.: 14/798,563

(22) Filed: Jul. 14, 2015

(65) Prior Publication Data

US 2017/0017166 A1   Jan. 19, 2017

(51) Int. Cl.
*G03F 7/20* (2006.01)
*G03F 9/00* (2006.01)

(52) U.S. Cl.
CPC ................ *G03F 7/70633* (2013.01)

(58) Field of Classification Search
CPC .................................. G03F 7/70633
USPC ............................ 430/22, 30, 394
See application file for complete search history.

(56) References Cited

U.S. PATENT DOCUMENTS

| | | | |
|---|---|---|---|
| 6,737,208 B1* | 5/2004 | Bode .................. | G03F 7/70525 430/22 |
| 6,780,550 B2* | 8/2004 | Laughery ............ | G03F 7/70633 257/E23.179 |
| 2014/0240703 A1 | 8/2014 | Lee et al. | |

FOREIGN PATENT DOCUMENTS

WO   2008025492 A1   3/2008

OTHER PUBLICATIONS

Shanmugasundram, et al.; "Integrated Metrology and Advanced Process Control in Semiconductor Manufacturing"; Applied Materials, Feb. 25, 2002, p. 1.

* cited by examiner

*Primary Examiner* — Christopher Young
(74) *Attorney, Agent, or Firm* — Eschweiler & Potashnik, LLC (57) ABSTRACT

The present disclosure relates to a method of semiconductor processing. The method includes, receiving a first wafer having a photoresist coating on a face of the first wafer. An exposure unit is used to perform a first number of radiation exposures on the photoresist coating, thereby forming an exposed photoresist coating. The exposed photoresist coating is developed, thereby forming a developed photoresist coating. An OVL measurement zone pattern is selected from a number of different, pre-determined OVL measurement zone patterns based on at least one of: the first number of radiation exposures performed on the first wafer or a previous number of radiation exposures performed on a previously processed wafer, which was processed before the first wafer. A number of OVL measurements are performed on the developed photoresist coating within the selected OVL measurement zone pattern.

20 Claims, 4 Drawing Sheets

SYNCHRONIZED INTEGRATED METROLOGY FOR OVERLAY-SHIFT REDUCTION

BACKGROUND

The following disclosure relates to overlay (OVL) metrology and methods to achieve reduction in OVL-shift between two or more alignment events while maintaining manufacturing throughput for semiconductor fabrication process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first wafer" described in connection with a first figure may not necessarily corresponding to a "first wafer" described in connection with another figure.

Integrated circuits (ICs) are normally made through multiple process steps in a semiconductor wafer fabrication facility, where each process step places a patterned layer on a wafer. In order for the ICs to operate correctly, these patterned layers must be aligned accurately with each other. Misalignment between the patterned layers may cause short circuits or connection failures which significantly impact device yield. Misalignment measurement between patterned layers, i.e. overlay (OVL) metrology, on the wafer is one of the most important processes in the manufacturing integrated circuit devices. In particular, OVL metrology refers to the determination of the alignment accuracy of one patterned layer with respect to another patterned layer next to it. With the increase in complexity of integrated circuits, the measurement of the OVL metrology becomes more and more important and difficult.

Traditional lot-to-lot process control monitors wafers after processing using external metrology, and does not provide a rapid response back to the process tool. Thus, potentially allowing some scrapped lots. This is particularly unacceptable for larger wafer sizes. Advanced Process Control (APC) has become a critical component to improve the performance, yield, throughput, and flexibility of the manufacturing process through run-to-run, wafer-to-wafer and within wafer control. Wafer-to-wafer control provides control to every wafer within a lot independently, since wafers are monitored as they exit the processing chamber and adjustments are made rapidly to the process for subsequent wafers. In this case, inline integrated metrology is important to achieve quick feedback of any process variation or excursion. A key component of effective APC is that metrology tools are available to measure key parameters within an acceptable time frame. Hence, it is desirable to prevent time delays in APC systems.

In a traditional fabrication facility that manufactures different product wafers with different patterns and feature sizes, integrated metrology (IM) systems have a fixed setting for performing OVL measurements, irrespective of the different product wafers that pass through them. Different product wafers are produced with different patterns. For example, one product wafer may contain patterns corresponding to microprocessors, while another product wafer may contain patterns corresponding to an application specific integrated circuit (ASIC) or a micro-electrical mechanical system (MEMS) device. To manufacture these different patterns on the wafers, corresponding patterns of transparent and opaque areas are formed on surfaces of quartz plates called photomasks or reticles. An exposure unit passes radiation through a reticle, forming an image of the reticle pattern. The image is focused and reduced by a lens, and projected onto the surface of the wafer that is coated with a photosensitive material called photoresist. Often, the image is "stepped" across individual exposure fields, which can for example correspond to individual dies on the wafer, to "imprint" the pattern into the photoresist. After exposure by the exposure unit, the coated wafer is developed, causing the photoresist to dissolve in certain areas according to the amount of light the areas received during exposure. These areas of photoresist and no photoresist reproduce the pattern on the reticle. The developed wafer is then passed through an OVL metrology unit in order to check for misalignments of the developed photoresist pattern with an underlying pattern previously formed on the wafer. Notably, because different product wafers have different patterns, different numbers of "steps" or exposure fields can be used to pattern the different product wafers.

Having the same OVL measurement settings for wafers having different number of exposed fields can negatively affect the OVL quality. For example, consider a case where a first wafer is coming out of the exposure unit of an IM system with 100 exposed fields. This first wafer is set to undergo 50 OVL measurements by an IM scanner in the OVL metrology unit. However, when a second wafer having 30 exposed fields passes through the same OVL metrology unit, the same 50 OVL measurements are performed on the second wafer. In such a scenario, the speed of the IM scanner becomes slow when compared to the new time requirement of the second wafer. Slower and unsynchronized OVL measurements can often lead to blocks in the IM scanner. These blocks in the IM scanner lead to cooling of the exposure scanner. As the system waits for the exposure scanner to reach to its correct scanning temperature, a following third wafer will miss its OVL measurements (or be delayed), as the IM system tries to compensate for the time delay. In a different scenario, if the second wafer has 200 exposed fields, then the IM scanner set to perform the 50 OVL measurements will complete the OVL measurements in less time than desired by the exposure scanner. In this case, the exposure scanner will have to move fast to expose the 200 fields in the set time cycle of the IM system, which will lead to exposure scanner heating. Heating of the exposure scanner will lead to gradual OVL shift because the exposure scanner is sensitive to temperature, and scanner heating causes drift in field-by-field dose and focus adjustments. Thus, as can be inferred from both the above cases, during un-synchronized OVL measurements, i.e., when the speed of the IM scanner does not correspond with the speed of the exposure scanner, the APC will not be able to fine tune the OVL error from wafer-to-wafer within the set time frame. Thus OVL shift will not be reduced.

Accordingly, the present disclosure is directed to a synchronized IM system that can change the IM scanner settings based on the number of exposed fields within a wafer, and/or can change the IM settings based on the numbers of exposed fields and/or IM measurements for consecutively processed wafers. A control unit that includes a synchronization unit performs the desired synchronization operation between the exposure unit and the OVL metrology unit. The exposure scanner sends a number of exposed fields (exposure) for a wafer to the control unit. Based on this number of exposed fields, the control unit selects an OVL measurement zone pattern from a predetermined set of OVL measurement zone patterns. Based on the selected OVL measurement zone pattern, the IM scanner performs OVL measurements within an area of the OVL measurement zone pattern, enabling sufficient number OVL measurements to be performed in a sufficient time zone, such that the flow of consecutive wafers is synchronized during production. This can also limit undesired temperature variations experienced by wafers in the exposure scanner, and correspondingly limits OVL variations.

Figure 1:
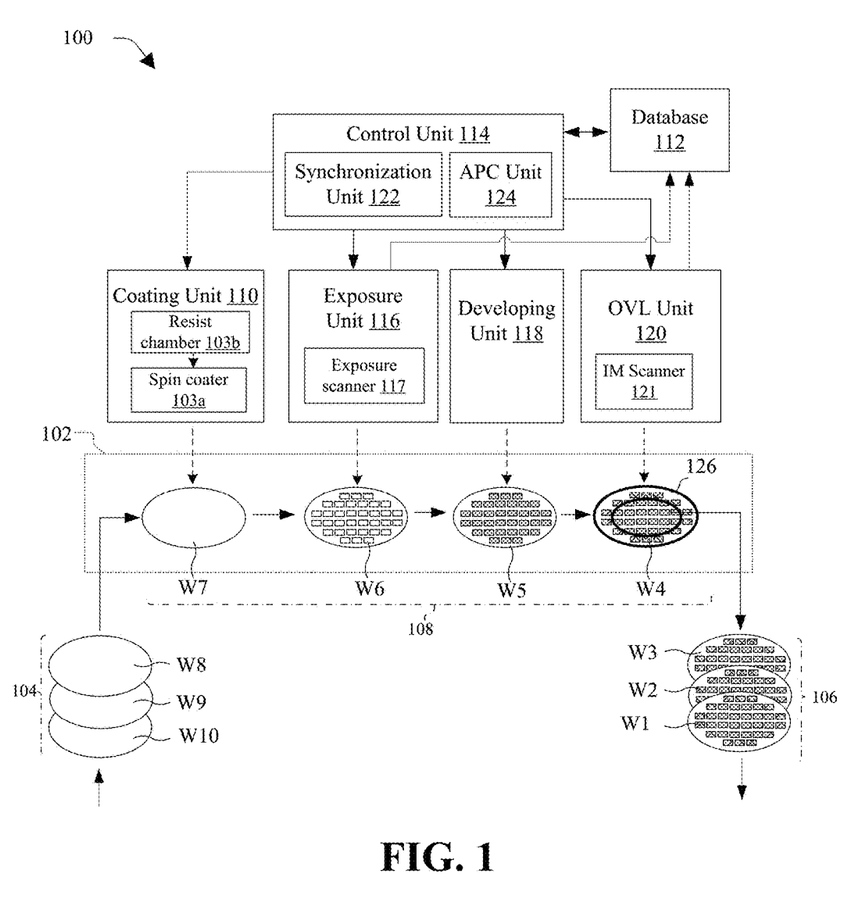
FIG. 1 illustrates a schematic representation of an integrated metrology (IM) system, according to some embodiments of the present disclosure.

With reference to FIG. 1, a schematic representation of an integrated metrology (IM) system 100, according to some embodiments of the present disclosure is provided. According to the IM system 100, a set of wafers is arranged to pass through a conveyor apparatus 102, where the wafers go through a set of semiconductor manufacturing and OVL measurement processes. The set of wafers include an incoming set of wafers 104 that are yet to pass through the manufacturing and OVL processing, an outgoing set of wafers 106 that have completed manufacturing and OVL processing, and an active set of wafers 108 that are undergoing manufacturing or OVL processing. The outgoing set of wafers 106 includes wafers W1-W3, the active set of wafers 108 includes wafers W4-W7, and the incoming set of wafers include wafers W8-W10.

The wafers on the conveyor apparatus 102 first pass through a coating unit 110. The coating unit 110 contains a spin coater 103a, which is supplied with various photoresist chemicals contained within a resist chamber 103b. As illustrated in FIG. 1, wafer W7 is disposed below the coating unit 110 to undergo the photoresist coating process. An output from the coating unit 110 is provided to a database 112 which stores all information about the number of wafers that passes through the coating unit 110. The database 112 may include any type of storage device configured to store, data, programs, and other information. In some embodiments, the database 112 may include, for example, one or more of a hard disk drive, a magnetic disk drive, or an optical disk drive.

A control unit 114 controls the coating unit 110 and other parts of the IM system 100. A two way connection exists between the control unit 114 and the database 112, so that the control unit 114 can provide data to the database 112 as well as adjust the actions of other devices connected to the control unit 114, based on the information provided by the database 112. After undergoing the coating process by the coating unit 110, a wafer on the conveyer apparatus 102 passes through an exposure unit 116. In some embodiments, the exposure unit 116 is housed in a vacuum chamber (not shown), to achieve an ultra-high vacuum, or UHV (e.g., $1 \times 10^{-12}$ to $1 \times 10^{-9}$ Torr). Typical exposure units include an illumination source (not shown) and a photomask or reticle (not shown) between the illumination source and the wafer to be exposed. Modern exposure units include exposure scanners that include movable parts. Exposure scanners increase the length of the area exposed in each exposure shot (exposure field) by moving a reticle stage and a wafer stage in opposite directions to each other during the exposure. Instead of exposing the entire field at once, the exposure is made through an "exposure slit" that is as wide as the exposure field, but only a fraction of its length. In some embodiments, the illumination source comprises an extreme ultraviolet (EUV) tool, or an electron beam direct write (EBDW) tool. The exposure unit 116 includes the exposure scanner 117, which exposed the photoresist coated wafer W6 with a radiation and transferred the pattern on the reticle to the surface of the wafer W6. The exposure unit 116 has an output going to the database 112, where information on the number of exposed fields or exposure count is sent to the database 112. Based on this information, the control unit 114 controls the actions of the exposure unit 116.

Once exposed, the wafer on the conveyer apparatus 102 moves to the developing unit 118. Development causes the photoresist coated wafer to dissolve in certain areas according to the amount of light the areas received during exposure. These areas of photoresist and no photoresist reproduce the pattern on the reticle. Wafer W5 disposed below the developing unit 118 is an illustration of a developed wafer.

After developing, the wafer on the conveyor apparatus 102 moves to the OVL metrology unit 120. The OVL metrology unit 120 includes an IM scanner 121 which performs OVL measurements on a developed wafer. The OVL metrology unit 120 has an output going to the database 112 as well as an input coming from the control unit 114. In some embodiments, the control unit 114 comprises a synchronization unit 122 and an automatic process control (APC) unit 124. In another embodiments, the control unit 114 may also include and an application programming interface (API) (not shown). In some embodiments, the APC unit 124 provides stable processing conditions as well as adjusts device properties, and the API provides a unified interface for accessing and interacting with the database 112.

According to the present disclosure, the synchronization unit 122 has an important role in the working of the OVL metrology unit 120. Once the control unit 114 receives an exposure count of a wafer from the exposure scanner 117 (through the database 112), that information is sent to the synchronization unit 122. The synchronization unit 122 has a predetermined set of OVL measurement zone patterns, wherein different OVL measurement zone patterns correspond to different exposure counts. Based on the exposure count received, the synchronization unit 122 selects an OVL measurement zone pattern and instructs the OVL metrology unit 120 to perform OVL measurements within that zone. For example, assume W6 has 100 exposed fields, and the exposure unit 116 sends an exposure count of 100 to the control unit 114 through the database 112. The synchronization unit 122 picks up an OVL measurement zone pattern, say zone 3 corresponding to the 100 exposure count. This information is sent to the OVL metrology unit 120, and when wafer W6 reaches the OVL metrology unit 120, the IM scanner 121 performs OVL measurements within zone 3 on W6. The number of OVL measurements performed on W6 is proportional to the exposure count 100. Further, the number of OVL measurements performed on W6 corresponds to an OVL measurement time during which the OVL measurements are taken. This OVL measurement time is chosen in a way to offset a difference in the time taken to expose W6 and the incoming wafer W7.

In FIG. 1, wafer W4 illustrates an example of a wafer that has undergone IM scanning or OVL measurements within an OVL measurement zone pattern 126. Zone 126 was chosen by the synchronization unit 122, based on the number of exposed fields on wafer W4, or based on a number of exposed fields or OVL measurements for an immediately processed wafer (e.g., W3). During overlay measurements, the IM scanner 121 is configured to determine locations of a plurality of alignment shapes formed on a patterning apparatus (not shown) relative to first locations of a plurality of first alignment shapes disposed on a surface of the wafer W4.

In some embodiments the OVL metrology unit 120 is further configured to predict an OVL error for each field of a wafer, and send that information to the database 112. The control unit 114 receives the OVL error from the database 112 and the APC unit 124 within the control unit 114. The APC unit 124 can tune the position of the reticle stage (not shown), focus the lens, or change a dose of the illumination source within the exposure unit 116 based upon the values of the OVL error.

Advantageously, the synchronization unit 122 helps in choosing a proportional number of OVL measurement fields for the IM scanner 121 by selecting an appropriate OVL measurement zone pattern (example zone 126). Selecting this zone and performing the right number of OVL measurements will help in smooth functioning of the IM scanner 121, eliminating temperature variations in the exposure scanner 117, and improving the quality of OVL measurements. Furthermore, as more number of wafers pass through the IM system 100, the OVL error reduces. i.e., control unit 114 is controlling the process tool simultaneously as it receives corrective algorithms from the APC unit 124 based on data obtained after OVL measurements on each wafer. For example, based on the OVL error predicted from wafers W1, W2 . . . etc., corrective measures will be done on the process tools, before wafers W4, W5 etc. get to those process tools (exposure unit 116, developing unit 118 etc.). Thus, after performing OVL measurements, wafer W10 will have the very little OVL error when compared to wafer W1 which passed through the OVL measurement first.

It should be noted that the modules and devices in FIG. 1 may all be implemented on one or more processor based systems. Communication between the different modules and devices may vary depending upon how the modules are implemented. If the modules are implemented on one processor based system, data may be saved in a memory or database 112 between the execution of program code for different steps by the control unit 114. The data may then be provided by the control unit 114 accessing the memory or database 112 via a bus during the execution of a respective step. If modules are implemented on different processor based systems or if data is to be provided from another storage system, such as a separate database, data can be provided between the systems through an I/O interface or a network interface. Similarly, data provided by the devices or stages may be input into one or more processor based system by the I/O interface or network interface. A person having ordinary skill in the art will readily understand other variations and modifications in implementing systems and methods that are contemplated within the scope of varying embodiments.

FIG. 2A-2F illustrate several examples of how exposure scanning and OVL measurement zone patterns can be used on different wafers according to some embodiments of the present disclosure.

Figure 2A:
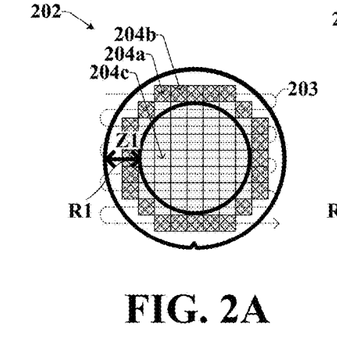
FIG. 2A-2F illustrate different OVL measurement zone patterns on surfaces of different wafers, according to some embodiments of the present disclosure.

FIG. 2A illustrates a semiconductor wafer 202 made up of different exposure fields 204a, 204b, 204c etc. These exposure fields (204a, 204b, 204c . . . ) are formed when an exposure unit, such as exposure unit 116 in FIG. 1, exposes photoresist on the semiconductor wafer 202 to a pattern of radiation to be imprinted in the photoresist. For example, in FIG. 2A's example, the exposure unit can "step" to a first exposure field 204a and expose the photoresist in that first exposure field 204a to a reticle pattern, then step to a second exposure field 204b and expose the photoresist in the second exposure field 204b to the reticle pattern, and so on. In some embodiments, the exposure unit can "step" through the fields in a scan pattern as indicated by arrow 203. Note that an individual exposure field (e.g., 204a) can correspond to an individual die, or only a portion of an individual die, or multiple die. After the exposure unit has scanned the exposure fields, the wafer 202 is developed so some areas of photoresist remain in place while photoresist is removed (e.g., dissolved) from other areas of the wafer.

Figures 2B, 2C:
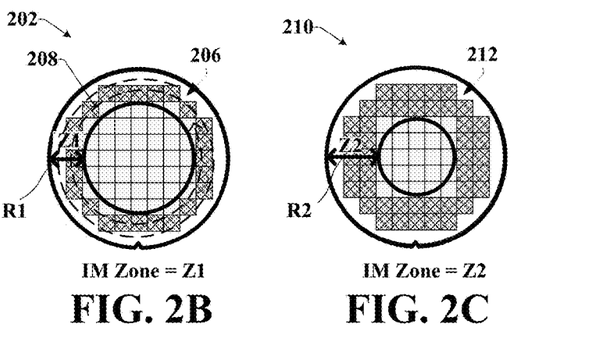

In FIG. 2B, an OVL measurement unit, such as OVL measurement unit 120 in FIG. 1 for example, performs OVL measurements to determine whether the reticle pattern imprinted on the wafer 202 is properly aligned with an underlying pattern or layer previously formed on the wafer. To this end, FIG. 2B illustrates an OVL measurement zone pattern Z1, which is a ring-shaped region along an outer edge of the wafer 202, having radial thickness R1. OVL measurements are performed on exposure fields within a first outer OVL region 206, which may be referred to as a first zone (zone 1, Z1). The number of OVL measurements corresponds with the number of exposed fields of wafer 202 or for a wafer processed immediately before or immediately after wafer 202, which provides a synchronized relationship between OVL measurement tool and exposure tool. Radius R1 represents an IM mark that corresponds with OVL measurement zone pattern Z1. As shown by line 208, the IM scanner 121 performs OVL measurements by moving in a circular direction along zone Z1 starting from an outer edge of wafer 202.

FIG. 2C illustrates an OVL measurement zone pattern Z2, which is a ring-shaped region along an outer edge of the wafer 210, having a radial thickness R2. OVL measurements are performed on exposure fields within a second outer OVL region 212, which may be referred to as a second zone (zone 2, Z2). The number of OVL measurements corresponds with the number of exposed fields of wafer 210 or for a wafer processed immediately before or immediately after wafer 210, which provides a synchronized relationship between OVL measurement tool and exposure tool.

Figure 2D:
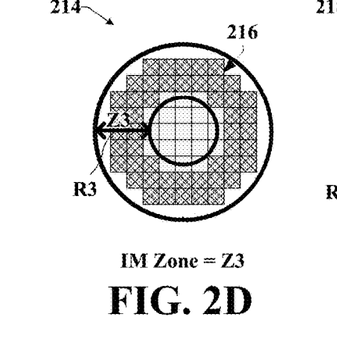

FIG. 2D illustrates an OVL measurement zone pattern Z3, which is a ring-shaped region along an outer edge of the wafer 214, having a radius R3. OVL measurements are performed on exposure fields within a third outer OVL region 216, which may be referred to as a third zone (zone 3, Z3). The number of OVL measurements corresponds with the number of exposed fields of wafer 214 or for a wafer processed immediately before or immediately after wafer 214, which provides a synchronized relationship between OVL measurement tool and exposure tool.

Figure 2E:
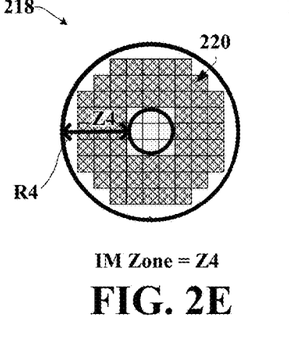

FIG. 2E illustrates an OVL measurement zone pattern Z4, which is a ring-shaped region along an outer edge of the wafer 218, having a radius R4. OVL measurements are performed on exposure fields within a fourth outer OVL region 220, which may be referred to as a fourth zone (zone 4, Z4). The number of OVL measurements corresponds with the number of exposed fields of wafer 218 or for a wafer processed immediately before or immediately after wafer 218, which provides a synchronized relationship between OVL measurement tool and exposure tool.

Figure 2F:
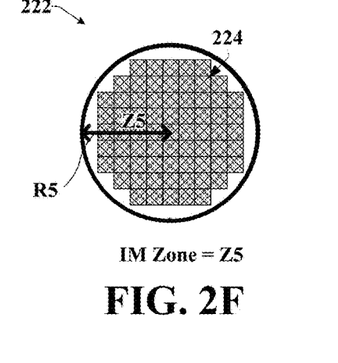

FIG. 2F illustrates an OVL measurement zone pattern Z5, which is a ring-shaped region along an outer edge of the wafer 222, having a radius R5. OVL measurements are performed on exposure fields within a fifth outer OVL region 224, which may be referred to as a fifth zone (zone 5, Z5). The number of OVL measurements corresponds with the number of exposed fields of wafer 222 or for a wafer processed immediately before or immediately after wafer 222, which provides a synchronized relationship between OVL measurement tool and exposure tool.

Figure 3:
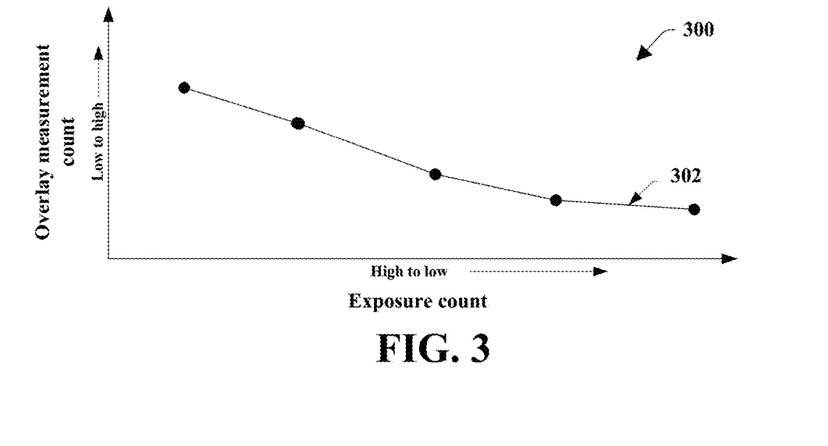
FIG. 3 illustrates a graphical representation on the relationship between a number of OVL measurements and a number of exposure counts, according to some embodiments of the present disclosure.

FIG. 3 illustrates a graphical representation 300 on the relationship between the number of OVL measurements and the number of exposed fields on a wafer or between successive wafers, according to some embodiments of the present disclosure.

With reference to FIG. 3, X-axis of graph 300 represents a decreasing trend of exposure counts, where an exposure count is a total number of exposed fields or exposure scans performed on a wafer by the exposure scanner 117. Y-axis on graph 300 represents an increasing trend of OVL measurement counts, where an OVL measurement count stands for the total number of OVL measurements performed on a single wafer or between successive wafers by the IM scanner 121. From plot 302, it can be inferred that as the number of exposure count decreases, the number of OVL measurement count also decreases. This indicates that, the synchronization unit 122 provides a synchronized correlation between the number of exposed fields on a wafer and the OVL measurements performed on the wafer or a wafer immediately before or immediately after the wafer.

Advantageously, the synchronization between the exposure counts and the OVL measurement counts helps reduce unexpected heating and cooling of the exposure scanner and improves the quality of the net OVL metrology system. Choosing the right OVL measurement zone for a particular exposure count also helps in smooth working of the IM scanner, efficient cycle time reduction and rapid APC reaction for the IM system.

Figure 4:
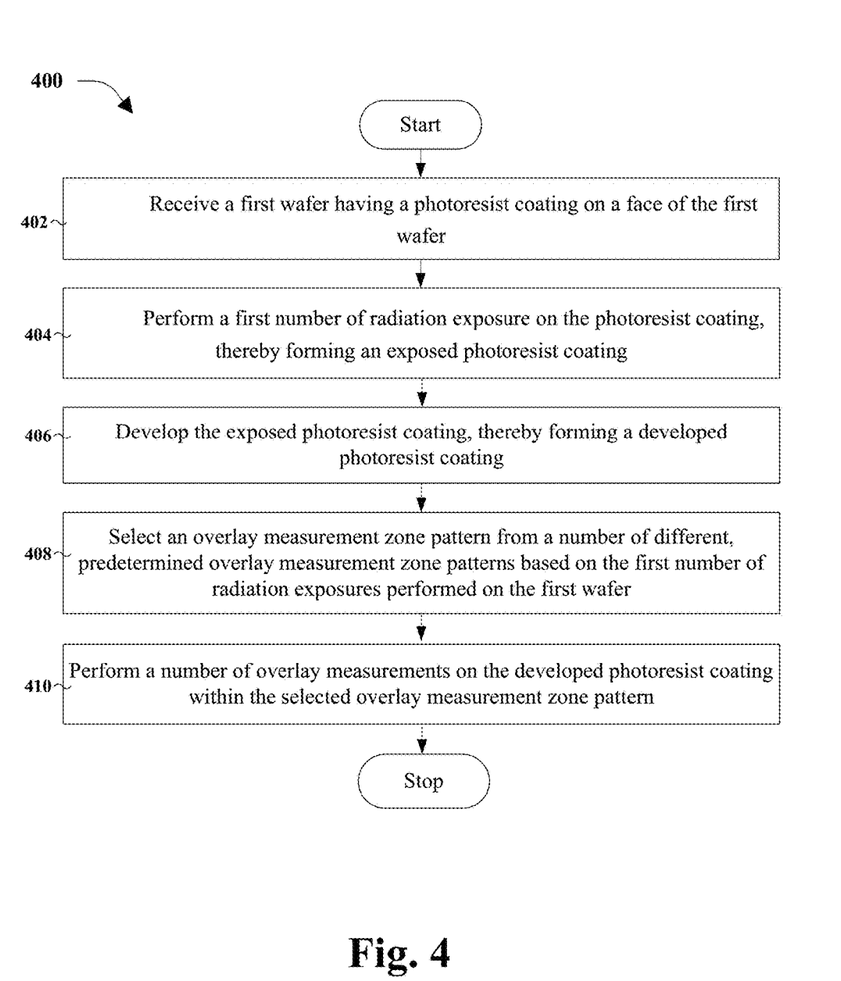
FIG. 4 illustrates a flow diagram of some embodiments of a method for performing OVL measurements over a wafer, according to the present disclosure.

FIG. 4 illustrates a flow diagram of some embodiments of a method 400 for performing OVL measurements over a wafer, according to the present disclosure.

At 402, a first wafer having a photoresist coating is received.

At 404, a first number of radiation exposures is performed on the photoresist coating, thereby forming an exposed photoresist coating.

At 406, the exposed photoresist coating is developed, thereby forming a developed photoresist coating.

At 408, an OVL measurement zone pattern is selected from a number of different, predetermined OVL measurement zone patterns, based on the first number of radiation exposures performed on the first wafer.

At 410, a number of OVL measurements is performed on the developed photoresist coating within the selected OVL measurement zone pattern.

Figure 5:
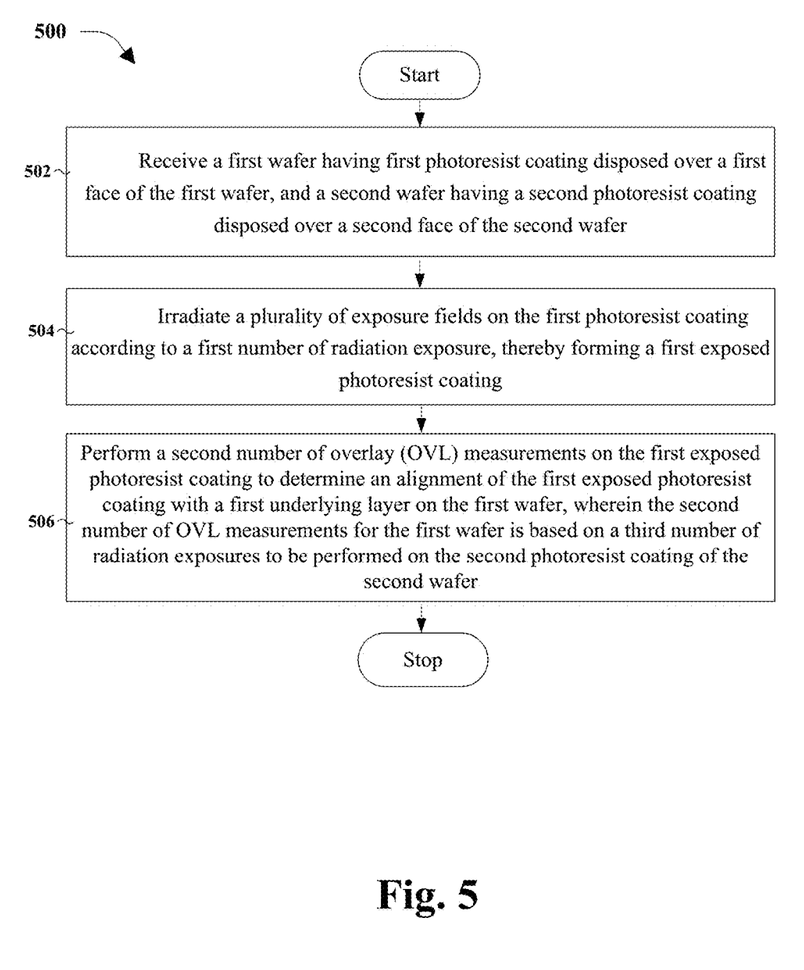
FIG. 5 illustrates a flow diagram of some embodiments of a method for performing OVL measurements over a wafer, according to the present disclosure.

FIG. 5 illustrates a flow diagram of some embodiments of a method for performing OVL measurements over a wafer, according to the present disclosure.

At 502, a first wafer having first photoresist coating disposed over a first face of the first wafer, and a second wafer having a second photoresist coating disposed over a second face of the second wafer are received.

At 504, a plurality of exposure fields are irradiated on the first photoresist coating according to a first number of radiation exposures, thereby forming a first exposed photoresist coating.

At 506, a second number of overlay (OVL) measurements are performed on the first exposed photoresist coating to determine an alignment of the first exposed photoresist coating with a first underlying layer on the first wafer, wherein the second number of OVL measurements for the first wafer is based on a third number of radiation exposures to be performed on the second photoresist coating of the second wafer. The second wafer is to be processed immediately after the first wafer in a sequence of wafers to be processed. For example with regards to previously illustrated FIG. 1, the first wafer could correspond to wafer W4, and the second wafer could correspond to wafer W5. In such an example, the number of OVL measurements for wafer W4 could be set based on the number of exposures to be performed on wafer W5. Thus, if wafer W5 has a large number of exposures, a proportionally large number of OVL samples can be performed on wafer W4 to allow for more precise alignment. Conversely, if wafer W5 uses only a small number of exposures, a proportionally small number of OVL samples can be performed on wafer W4 to keep the sequence of wafers moving smoothly in synchronized fashion. In this example, wafer W4 can be processed in OVL unit 120 concurrently with wafer W5 is being processed by exposure unit 116, wherein concurrently implies there is at least some overlapping time for this processing and wherein concurrently can be simultaneous but is not necessarily simultaneous.

In 508, after the second number of OVL measurements are performed on the first exposed photoresist coating, the OVL metrology unit can perform a fourth number of OVL measurements on the second exposed photoresist coating to determine an alignment of the second exposed photoresist coating with a second underlying layer on the second wafer. The fourth number of OVL measurements for the second wafer can be based on the third number of radiation exposures to be performed on the second wafer, or for those of another wafer immediately following the second wafer.

While the disclosed methods (e.g., the methods described by the flow diagrams 400 and 500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

The present disclosure provides a system, including, a coating unit configured to dispense photoresist coatings onto a sequence of wafers, wherein a first semiconductor wafer is processed prior to a second semiconductor wafer in the sequence. An exposure unit is configured to irradiate the photoresist coatings of the first and second semiconductor wafers with first and second numbers of radiation exposures, respectively, thereby providing first and second exposed photoresist coatings, respectively. A developing unit is configured to develop the first and second exposed photoresist coatings, respectively, thereby proving first and second developed photoresist coatings, respectively. An OVL metrology unit is configured to set a number of OVL measurements samples on the second wafer based on the first or second number of radiation exposures.

Thus, as can be appreciated from above, the present disclosure provides a method of semiconductor processing. The method includes, receiving a first wafer having a photoresist coating on a face of the first wafer. An exposure unit is used to perform a first number of radiation exposures on the photoresist coating, thereby forming an exposed photoresist coating. The exposed photoresist coating is developed, thereby forming a developed photoresist coating. An OVL measurement zone pattern is selected from a number of different, pre-determined OVL measurement zone patterns based on at least one of: the first number of radiation exposures performed on the first wafer or a previous number of radiation exposures performed on a previously processed wafer, which was processed before the first wafer. A number of OVL measurements are performed on the developed photoresist coating within the selected OVL measurement zone pattern.

In other embodiments, the present disclosure provides a method of processing first and second wafers, which are consecutively processed in a fabrication facility which includes an exposure unit and an OVL metrology unit. The method includes, receiving the first and second wafers, wherein first a first photoresist coating is disposed over a first face of the first wafer and a second photoresist coating is disposed over a second face of the second wafer. The exposure unit is used to irradiate a plurality of exposure fields on the first photoresist coating according to a first number of radiation exposures, thereby forming a first exposed photoresist coating. After forming the first exposed photoresist coating, the OVL metrology unit is used to perform a second number of OVL measurements on the first exposed photoresist coating to determine an alignment of the first exposed photoresist coating with a first underlying layer on the first wafer. The second number of OVL measurements for the first wafer is based on a third number of radiation exposures to be performed on the second photoresist coating of the second wafer.

In yet other embodiments, the present disclosure provides a method of semiconductor processing including, receiving a first wafer having a photoresist coating on a face of the first wafer. A first number of radiation exposures are performed on the photoresist coating using an exposure unit, thereby forming an exposed photoresist coating. The exposed photoresist coating is developed, thereby forming a developed photoresist coating. A first OVL measurement zone pattern is selected from a number of different, pre-determined OVL measurement zone patterns based on the first number of radiation exposures. A number of OVL measurements are performed on the developed photoresist coating within the selected first OVL measurement zone pattern. After performing the first number of radiation exposures on the photoresist coating of the first wafer, a second number of radiation exposures are performed on a photoresist coating of a second wafer, the second number of radiation exposures differing from the first number of radiation exposures. The exposed photoresist coating on the second wafer is developed, thereby forming a second developed photoresist coating. A second OVL measurement zone pattern is selected for the second wafer from the number of different, pre-determined OVL measurement zone patterns, the second OVL measurement zone pattern differing from the first OVL measurement zone pattern. A second number of OVL measurements are performed on the second developed photoresist coating within the second OVL measurement zone pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of semiconductor processing, including:
    receiving a first wafer having a photoresist coating on a face of the first wafer;
    using an exposure unit to perform a first number of radiation exposures on the photoresist coating, thereby forming an exposed photoresist coating;
    developing the exposed photoresist coating, thereby forming a developed photoresist coating;
    after the exposed photoresist coating has been developed selecting a first OVL measurement zone pattern from a number of different, pre-determined OVL measurement zone patterns based on at least one of: the first number of radiation exposures performed on the first wafer or a previous number of radiation exposures performed on a previously processed wafer, which was processed before the first wafer; and
    performing a number of OVL measurements on the developed photoresist coating within the selected first OVL measurement zone pattern.

2. The method of claim 1, further comprising:
determining whether the developed photoresist coating is aligned to an underlying feature on the first wafer based on the number of OVL measurements.

3. The method of claim 1, wherein the first OVL measurement zone pattern is a ring-shaped region along an outer edge of the face of the first wafer.

4. The method of claim 3, wherein an area of the ring-shaped region is proportional to the first number of radiation exposures performed on the photoresist coating.

5. The method of claim 1, further comprising:
after performing the first number of radiation exposures on the photoresist coating of the first wafer, using the exposure unit to perform a second number of radiation exposures on a photoresist coating of a second wafer, the second number of radiation exposures differing from the first number of radiation exposures;
developing the exposed photoresist coating on the second wafer, thereby forming a second developed photoresist coating;
selecting a second OVL measurement zone pattern for the second wafer from the number of different, pre-determined OVL measurement zone patterns, the second OVL measurement zone pattern differing from the first OVL measurement zone pattern; and
performing a second number of OVL measurements on the second developed photoresist coating within the second OVL measurement zone pattern.

6. The method of claim 5, wherein the second number of radiation exposures is less than the first number of radiation exposures, and wherein the second OVL measurement zone pattern has a smaller area than that of the first OVL measurement zone pattern.

7. The method of claim 5, wherein the second number of radiation exposures is greater than the first number of radiation exposures, and wherein the second OVL measurement zone pattern has a larger area than that of the first OVL measurement zone pattern.

8. The method of claim 7, wherein the first and second OVL measurement zone patterns are ring-shaped patterns with outer diameters corresponding to an outer edge of the first wafer, and inner diameters that are different from one another.

9. The method of claim 7, a difference in area between the first and second OVL measurement zone patterns, is proportional to a difference in number between the first and second number of radiation exposures.

10. The method of claim 1, wherein performing a number of OVL measurements comprises, moving an IM scanner along the first wafer in a circular motion corresponding to the first OVL measurement zone pattern starting from an outer edge of the first OVL measurement zone pattern.

11. The method of claim 1, wherein the number of different, pre-determined OVL measurement zone patterns includes three or more different, pre-determined OVL measurement zone patterns.

12. A method of processing first and second wafers, which are consecutively processed in a fabrication facility which includes an exposure unit and an OVL metrology unit, the method including:
receiving the first and second wafers, wherein a first photoresist coating is disposed over a first face of the first wafer and a second photoresist coating is disposed over a second face of the second wafer;
using the exposure unit to irradiate a plurality of exposure fields on the first photoresist coating according to a first number of radiation exposures, thereby forming a first exposed photoresist coating; and
after forming the first exposed photoresist coating, using the OVL metrology unit to perform a second number of OVL measurements on the first exposed photoresist coating to determine an alignment of the first exposed photoresist coating with a first underlying layer on the first wafer, wherein the second number of OVL measurements for the first wafer is based on a third number of radiation exposures to be performed on the second photoresist coating of the second wafer.

13. The method of claim 12, further comprising:
after the second number of OVL measurements are performed on the first exposed photoresist coating, using the OVL metrology unit to perform a fourth number of OVL measurements on the second exposed photoresist coating to determine an alignment of the second exposed photoresist coating with a second underlying layer on the second wafer, wherein the fourth number of OVL measurements for the second wafer is based on the third number of radiation exposures to be performed on the second wafer.

14. The method of claim 13, further comprising:
irradiating the second photoresist coating with the third number of radiation exposures concurrently with performance of the second number of OVL measurements on the first wafer.

15. The method of claim 13, wherein:
the second number of OVL measurements are performed on a first OVL measurement zone pattern, which is selected from a number of different, pre-determined OVL measurement zone patterns based on at least one of: the first number of radiation exposures performed on the first wafer or a previous number of radiation exposures performed on a previously processed wafer, which was processed before the first wafer; and
the fourth number of OVL measurements are performed on a second OVL measurement zone pattern, which is based on the third number of radiation exposures.

16. The method of claim 15, wherein the first OVL measurement zone pattern is a ring-shaped region along an outer edge of the face of the first wafer.

17. The method of claim 15, a difference in area between the first and second OVL measurement zone patterns, is proportional to a difference in number between the first and third number of radiation exposures.

18. A method of semiconductor processing, including:
receiving a first wafer having a photoresist coating on a face of the first wafer;
using an exposure unit to perform a first number of radiation exposures on the photoresist coating, thereby forming an exposed photoresist coating;
developing the exposed photoresist coating, thereby forming a developed photoresist coating;
selecting a first OVL measurement zone pattern from a number of different, pre-determined OVL measurement zone patterns based on the first number of radiation exposures;
performing a number of OVL measurements on the developed photoresist coating within the selected first OVL measurement zone pattern;
after performing the first number of radiation exposures on the photoresist coating of the first wafer, using the exposure unit to perform a second number of radiation exposures on a photoresist coating of a second wafer, the second number of radiation exposures differing from the first number of radiation exposures;

developing the exposed photoresist coating on the second wafer, thereby forming a second developed photoresist coating;

selecting a second OVL measurement zone pattern for the second wafer from the number of different, pre-determined OVL measurement zone patterns, the second OVL measurement zone pattern differing from the first OVL measurement zone pattern; and performing a second number of OVL measurements on the second developed photoresist coating within the second OVL measurement zone pattern.

19. The method of claim 18, wherein the first and second OVL measurement zone patterns are ring-shaped patterns with outer diameters corresponding to an outer edge of the first wafer, and inner diameters that are different from one another.

20. The method of claim 18, a difference in area between the first and second OVL measurement zone patterns, is proportional to a difference in number between the first and third number of radiation exposures.

* * * * *